United States Patent [19]

Steinbuch et al.

[11] Patent Number: 5,740,090
[45] Date of Patent: Apr. 14, 1998

[54] FILTER, REPETITIVE CONTROL SYSTEM AND LEARNING CONTROL SYSTEM BOTH PROVIDED WITH SUCH FILTER

[75] Inventors: Maarten Steinbuch; Gerrit Schootstra, both of Eindhoven, Netherlands

[73] Assignee: U.S. Philips Corporation, New York, N.Y.

[21] Appl. No.: 549,108

[22] Filed: Oct. 27, 1995

[30] Foreign Application Priority Data

Oct. 28, 1994 [EP] European Pat. Off. ............. 94203148

[51] Int. Cl.⁶ .................................................. G06F 17/10
[52] U.S. Cl. ............................... 364/724.07; 364/724.16
[58] Field of Search .......................... 364/724.07, 724.16

[56] References Cited

U.S. PATENT DOCUMENTS 4,821,168   4/1989   Gotou ........................... 364/183

OTHER PUBLICATIONS

Moore et al., "Iterative Learning Control: A Survey and New Results" Journal of robotic systems, vol. 9(5), 1992, pp. 563–593.

Tomizuka et al., "Discrete Domain Analysis and Synthesis of Repetitive Controllers", Proc. 1988, American Control Conference, Jun. 1988, pp. 860–866.

Primary Examiner—Reba I. Elmore
Assistant Examiner—Robert J. Dolan
Attorney, Agent, or Firm—Michael E. Belk

[57] ABSTRACT

Repetitive control systems and learning control systems using filters composed of delay circuits and having parameters resulting in a very high loop gain for only specific frequencies. The result of this is a substantial reduction of periodic disturbances with frequencies corresponding to the specific frequencies. The parameters of the filters are selected such that the robustness for frequency-variations in the periodic disturbances is improved.

5 Claims, 2 Drawing Sheets

FILTER, REPETITIVE CONTROL SYSTEM AND LEARNING CONTROL SYSTEM BOTH PROVIDED WITH SUCH FILTER

BACKGROUND OF THE INVENTION

The invention relates to a filter having a transfer function H=G/(1−G) with G in at least a predetermined frequency range substantially equal to $$\sum_{n=1}^{N} Wn \cdot e^{-nsTp},$$

or equal to $$\sum_{n=1}^{N} Wn \cdot z^{-qn}$$

with s being a Laplace operator, e the basic value of the natural logarithm and N an integer greater or equal to 2 and with q=Tp/Ts, with Ts a sample period in a time discrete system and q an integer and with $$\sum_{n=1}^{N} Wn$$

less than p, with p a value substantially equal to 1.
The invention further relates to a repetitive control system and a learning control system provided with such filter.

The use of such type of filters in repetitive control systems and learning systems is well-known. In such systems the filter exhibits a deep dip in the frequency transfer function for signals with frequencies corresponding to 1/Tp or a multiple of 1/Tp. The use of the filter in a repetitive control system is inter alia disclosed in U.S. Pat. No. 4,821,168. When Tp is selected equal to the period of a periodic disturbance this can be strongly reduced to a neglectable value. However the robustness for frequency variations of the periodic disturbances is low. This is due to the fact that the width of the dips in the frequency transfer characteristic is very narrow.

SUMMARY OF THE INVENTION

It is an object of the invention to provide a filter with improved robustness to frequency variations of the periodic disturbances.

According to the invention this object is achieved in a filter as defined in the opening paragraph and which is characterized in that $$\sum_{n=1}^{N} n \cdot Wn$$

is less than 1.
The invention is based on the insight that the condition that $$\sum_{n=1}^{N} n \cdot Wn,$$

which is indicative of derivative of frequency transfer function at the bottom of the dip in the transfer function, is less than the derivative of the known filter. This results in a wider dip in the frequency transfer function of the filter, compared with that of the filter disclosed in U.S. Pat. No. 4,821,168 due to the fact that for that filter disclosed in U.S. Pat. No. 4,821,168

$$\sum_{n=1}^{N} n \cdot Wn,$$

is larger than 1.

BRIEF DESCRIPTION OF THE DRAWINGS

Further advantageous embodiments of the memory control loop according to the invention will be described hereinafter in more detail with reference to FIGS. 1 to 4, in which.

DESCRIPTION OF THE PREFERRED EMBODIMENTS

In many control systems such as for example tracking servo systems in optical or magnetic recording the control system is disturbed by disturbances with a periodic nature. For instance the radial and focus track movement in optical disc recording systems exhibit a periodic disturbance with a frequency related to the disc rotational speed.

For these types of servo systems a known concept is the use of repetitive control, also known as memory control loops, digital comb filter etc. For a detailed description of repetition control loops reference is made to Tomizuka M., T. C. Tsao and K. K. Chen "Discrete domain analysis and synthesis of repetitive controllers" Proc. 1988, American Control Conference, June 1988, pp. 860–866.

Similar type of disturbances occur in situations where periodic tasks have to be performed, such as in pick and place machines, in robotics, etc. In this type situations often so-called learning systems are used. For a detailed description of learning systems reference is made to Moore, K. L. Dahley and S. P. Bhattacharya "Iterative learning control: a survey and new results" Journal of robotic systems" Vol. 9(5), 1992, pp. 563–593.

In repetitive control systems and learning systems a filter with a transfer function H(s)=G(s)/(1−G(s)) is used with $$G(s) = \sum_{n=1}^{N} Wn \, e^{-nsTp}$$

with e the basic value of the natural logarithm, with Tp a delay time, with s the Laplace operator, and with Wn a scaling factor for scaling the output signal of the $n^{th}$ delay in a sequence of delays. In the preceding the transfer function G is defined in the Laplace-domain. It will be evident for the skilled man that the transfer function can also be defined in the so-called z-domain. In the z-domain G is equal to $$\sum_{n=1}^{N} Wn \cdot z^{-q},$$

with q an integer equal to Tp/Ts and Ts the sampling time in the time discrete system defined in the z-domain.

Figure 1:
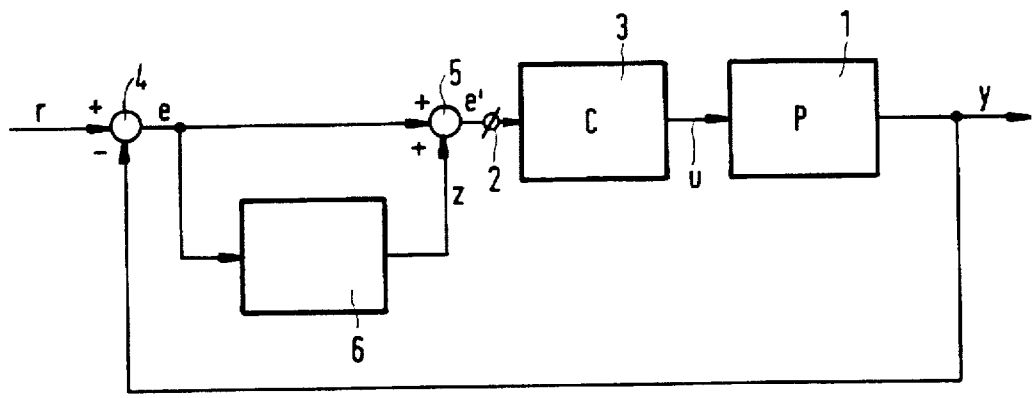
FIG. 1 shows a repetitive control system using a filter according to the invention.

FIG. 1 shows a block diagram of a repetitive control system using a filter according to the invention. In FIG. 1 the reference sign 1 indicates a process. An output signal y representing the instantaneous value of a process parameter to be controlled.

The output signal y is supplied to an inverting input of differential amplifier 4. A set point signal r is supplied to a non-inverting input of the amplifier 4. The amplifier 4 is deriving an error signal e indicative of the deviation between the output signal y and the set point signal r.

The error signal e is supplied to an input of a memory loop 6 and an adder 5. An output signal z of the memory loop 6 is supplied to a second input of the adder 5. An output signal (e') indicating the sum of the signals e and z is supplied by the adder 5 to a controller 3 for controlling the process 1.

Figure 2:
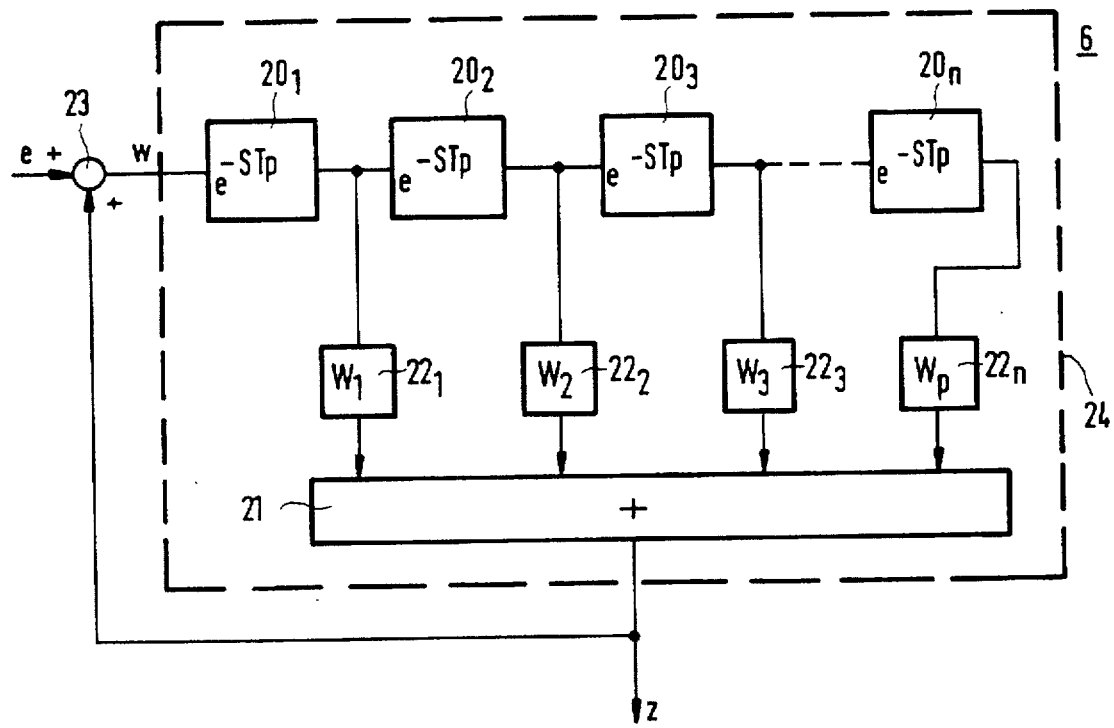
FIG. 2 shows the filter in more detail.

FIG. 2 shows a block diagram of an embodiment of the memory loop 6, comprising an adder 23 and a delay unit 24. The delay unit 24 comprising a plurality of delay circuits $20_1, 20_2, 20_3, \ldots, 20_n$ which are connected in series and an adder 21. Output signals of the delay circuits are supplied to the adder 21 via scaling circuits $22_1, 22_2, 22_3, \ldots 22_n$ for scaling the output signals with scaling factors $W_1, W_2, W_3, \ldots W_n$. An output of the adder 21 outputs the signal z, being sum of the scaled output signals of the delay circuits.

The output signal z is supplied to an input of the adder 23. The error signal e is fed to a second input of the adder 23. An output signal w being the sum of the signals z and e is supplied as input signal to the series connection of delay circuits $20_1, 20_2, 20_3, \ldots, 20_n$. The transfer functions H(s) of the memory loop 6 and the relation between the Laplace transform E(s) of the signal e and the Laplace transform Z(s) of the signal z are shown in the following equations. H(s)=Z(s)/E(s)=G(s)/(1-G(s)), with G(s) the transfer function of the delay unit 24.

Figure 3:
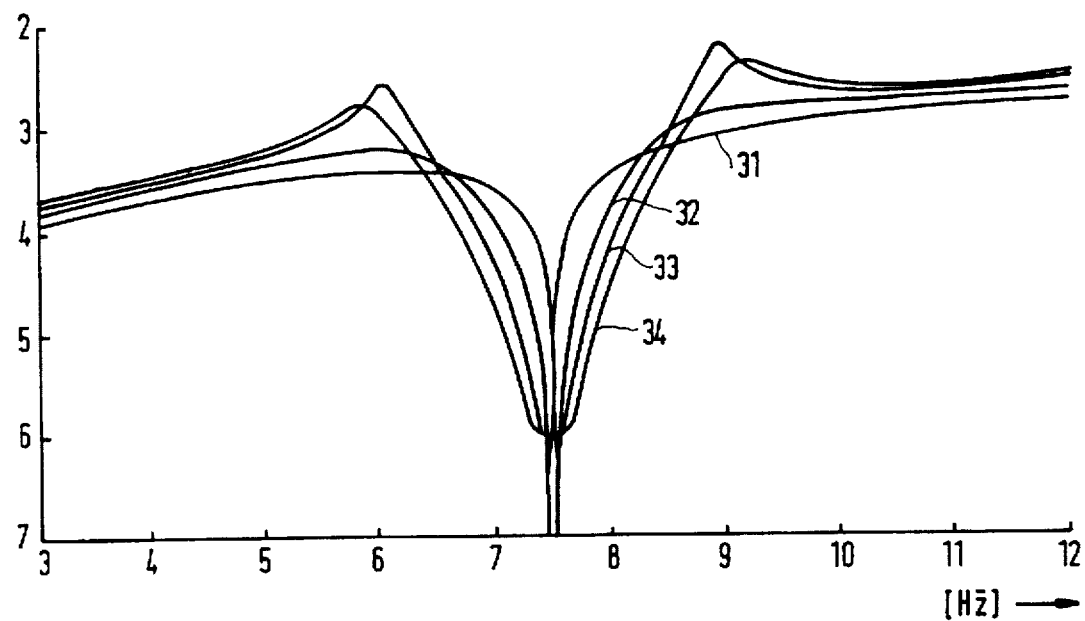
FIG. 3 shows transfer characteristics.

In a typical embodiment of the filter N delay circuits 20 are used, each with delay of Tp. It can be proven that it is possible to make the derivatives of the memory loop gain with respect to the frequency at $\omega=k^*\omega_p$ equal to zero, from the first up to the $(N-1)^{st}$ derivative. In case of $N \geq 2$ this means that the transfer function has a zero slope at these frequencies. As a result the width of frequency range where the loop gain is substantially increased, increases with N, without changing the amplitude of the reduction ratio. In FIG. 3 the sensitivities of a typical repetitive control loop functions are shown for N=1, 2, 3 and 4 (indicated by reference signs 31, 32, 33 and 34 respectively) with first derivative up to the $(N-1)^{st}$ derivative of the denominator of H(s) equal to zero.

By way of example for N=2 the calculation of the derivative will be illustrated hereinafter. The transfer function of the memory control loop for N=2 is represented by equation 1

$$\frac{(W_1 \cdot e^{-sTp} + W_2 \cdot e^{-2sTp})}{1 - W_1 \cdot e^{-sTp} - W_2 \cdot e^{-2sTp}} \quad (1)$$

The $0^{th}$ and $1^{st}$ derivative with respect to the frequency s=j$\omega$, with j=$\sqrt{-1}$, of the denominator of equation (1) have to be equal to zero. This is obtained with the following necessary and sufficient conditions:

$$1 - W_1 \cdot e^{-sTp} - W_2 \cdot e^{-2sTp} = 0 \text{ for } s = 2\pi j/Tp \quad (2)$$

$$\frac{d}{d\omega}(1 - W_1 \cdot e^{-sTp} - W_2 \cdot e^{-2sTp}) = 0 \text{ for } s = 2\pi j/Tp \quad (3)$$

For s=2πj/Tp Equation (2) leads to $$1-W_1-W_2=0 \quad (4)$$

Thus $W_1+W_2=1$
For s−2πj/Tp Equation (3) leads to:

$$-jTpW_1-2jTpW_2=0 \quad (5)$$

for $\omega=\omega_p$ this yields $W_1+2.W_2=0$.
Combining both results gives W2=−1 and W1=2.
The denominator thus becomes:

$$1-2e^{-sTp}+e^{-2sTp} \quad (6)$$

These coefficients are the same as those from the binomial series of which the signs of subsequent coefficients and of which the sum of coefficients is equal to 1. For N>2 the first derivative up to the N−1st derivative are zero when $$\sum_{n=1}^{N} n^i \cdot Wn = 0$$

for $i \leq N-1$.
This results in that the coefficients $W_n$ in the denominator form a binomial series (the first element of the series excluded) with alternating coefficients signs and a sum of coefficients equal to 1.

The invention is not limited to embodiments in which said first derivative of the memory loop gain with respect to the frequency is zero. An improvement of the robustness of an extended memory control loop (N≥2) compared with a memory loop with a single memory (N=1) is obtained when the sum $$s = \left( \sum_{n=1}^{N} n \cdot Wn \right),$$

which is indicative for the first derivative, is smaller than 1, being the value of the sum s for N=1.

So the width of dip in the frequency transfer function is wider for N≥2 than for N=1. It is preferred that the value of $$\sum_{n=1}^{N} n \cdot Wn$$

is substantially equal to zero, so as to achieve a maximum width of the dip. Stability is guaranteed when in the complex plane the poles of the transfer function H(s) are located within a unity circle with the center point in the origin of the complex plane.

By way of example an alterative method will be described to calculate the values for $W_n$ for which the stability is guaranteed and which result in excellent robustness and performance. According to this method the denominator $$\left( = 1 - \sum_{n=1}^{N} W_n e^{-nsT} \right)$$

of H(s) is rewritten as $(1-\alpha e^{-sTp})^N$. If α is chosen close to 1 but always ≤1 then stability is guaranteed, and the first up to the $(N-1)^{st}$ derivative are at the bottom of the dip close to zero. Note that the values of $W_n$ so obtained are close to a binomial series with alternating coefficient signs which results in the first up to the $(N-1)^{st}$ derivative close to zero, as already mentioned hereinbefore. Note that α can be substituted with a frequency dependent gain.

Figure 4:
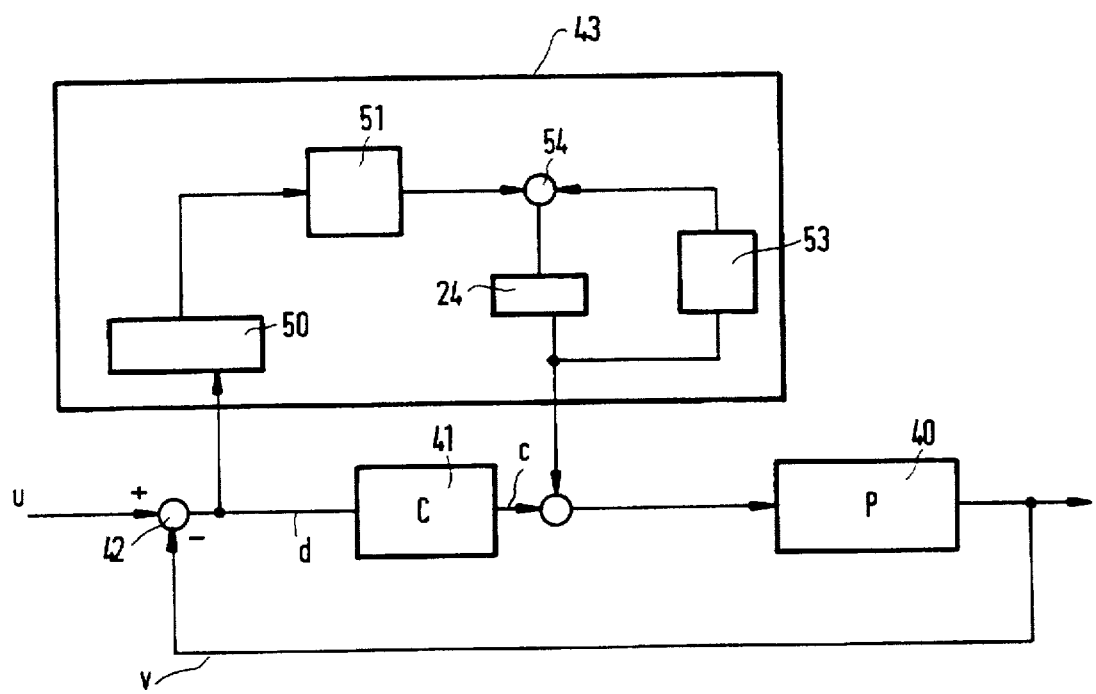
FIG. 4 shows a learning system using a filter according to the invention.

With reference to FIG. 1 the use of a filter according to the invention is described in detail for a repetitive control system. As already mentioned the filter is very suitable to be used in in learning systems. FIG. 4 shows such use in more detail. FIG. 4 shows a fed-back control system for controlling a process 40 by means of a controller 41 which is included in a fed-back loop, which further includes a comparator 42 for comparing a signal v representing output value of the process 40 with a signal u representing a desired set point value. The comparator 42 outputs a signal d representing the difference between the signals u and v. The signal d is supplied to the controller 41 which derives a control signal c for the process 40 on the basis of signal d. A unit 43 is connected in parallel over the controller 41. Unit 43 comprises a delay circuit 50 for storage of one period of the reference signal d. An output of delay circuit 50 is supplied to a linear filter 51 for stability. An output of linear filter 51 is fed to a memory loop comprising delay unit 24 a linear unit 53 and an adding (subtracting) circuit 54. The delay unit 24 has a transfer function $$G(s) = \sum_{n=1}^{N} W_n e^{-nsTp}.$$

We claim:

1. A filter having a transfer function H=G/(1−G) in which G is in at least a predetermined frequency range approximately equal to $$\sum_{n=1}^{N} W_n \cdot e^{-nsTp},$$

or equal to $$\sum_{n=1}^{N} W_n \cdot z^{qn},$$

with s being a Laplace operator, e being a basic value of a natural logarithm, N being an integer greater than or equal to 2, q being an integer equal to Tp/Ts, Ts being a sample period in a time discrete system, $$\sum_{n=1}^{N} W_n$$

being less than p, p being a value approximately equal to 1, and $$\sum_{n=1}^{N} n \cdot W_n$$

being less than 1.

2. The filter as claimed in claim 1, wherein $$\sum_{n=1}^{N} n \cdot W_n$$

is non negative and at least approximately equal to zero.

3. The filter as claimed in claim 1, wherein $$\sum_{n=2}^{N} n^i \cdot W_n$$

is approximately equal to zero, and i is less than or equal to N−1.

4. A repetitive control system provided with a filter as claimed in claim 1.

5. A learning control system provided with a filter as claimed in claim 1.

* * * * *